(12) United States Patent
Ayukawa

(10) Patent No.: US 7,993,730 B2
(45) Date of Patent: Aug. 9, 2011

(54) ELECTRO-OPTICAL DEVICE AND ELECTRONIC APPARATUS

(75) Inventor: Hiroshi Ayukawa, Nagano-ken (JP)

(73) Assignee: Sony Corporation, Tokyo (JP)

( * ) Notice: Subject to any disclaimer, the term of this patent is extended or adjusted under 35 U.S.C. 154(b) by 467 days.

(21) Appl. No.: 12/199,225

(22) Filed: Aug. 27, 2008

(65) Prior Publication Data
US 2009/0061166 A1   Mar. 5, 2009

(30) Foreign Application Priority Data

Sep. 5, 2007   (JP) .................................. 2007-229810
Jun. 16, 2008   (JP) .................................. 2008-156291

(51) Int. Cl.
*B32B 23/02*   (2006.01)

(52) U.S. Cl. ..... 428/194; 428/203; 428/343; 428/355 R; 345/204

(58) Field of Classification Search .................. 428/194, 428/203, 343, 355 R; 345/204
See application file for complete search history.

(56) References Cited

U.S. PATENT DOCUMENTS

| 7,460,112 B2 * | 12/2008 | Yamada | 345/204 |
| 2005/0007354 A1 * | 1/2005 | Yamada | 345/204 |

FOREIGN PATENT DOCUMENTS

| JP | 10-135683 | 5/1998 |
| JP | 11-259622 | 9/1999 |
| JP | 2006-038900 | 2/2006 |
| JP | 2007-025626 | 2/2007 |

* cited by examiner

*Primary Examiner* — Betelhem Shewareged
(74) *Attorney, Agent, or Firm* — K&L Gates LLP

(57) ABSTRACT

An electro-optical device includes: a display panel module having electronic parts provided therein; and an insulating tape that is adhered to the display panel module so as to cover the electronic parts. The insulating tape includes an adhesive portion and a non-adhesive portion. The non-adhesive portion is disposed at a position that covers a region in which the electronic parts are provided, and the adhesive portion is adhered to the display panel module in regions other than the region in which the electronic parts are provided.

10 Claims, 10 Drawing Sheets

100b

ELECTRO-OPTICAL DEVICE AND ELECTRONIC APPARATUS

RELATED APPLICATIONS

The present application is based on, and claims priority from, Japanese Patent Application Number 2007-229810, filed Sep. 5, 2007 and Japanese Patent Application No. 2008-156291, filed Jun. 16, 2008, the disclosures of which are hereby incorporated by reference in their entireties.

BACKGROUND

1. Technical Field

The present invention relates to an electro-optical device and an electronic apparatus applicable to display various information items.

2. Related Art

In general, a liquid crystal display device, which is an example of an electro-optical device, mainly includes a liquid crystal panel that serves as a display panel and has liquid crystal interposed between two substrates, and an illuminating device having a light guide plate and a light source, such as an LED (light emitting diode), that is provided on one end surface of the light guide plate.

In such a liquid crystal display device, the illuminating device is accommodated in a frame-shaped panel holding member, and the liquid crystal display panel is adhered to the panel holding member by a frame-shaped double-sided tape. A driver IC that drives the liquid crystal panel is provided on a substrate of the liquid crystal panel, and is connected to an external electronic apparatus through a flexible substrate (FPC: flexible printed circuit). The FPC connected to the substrate of the liquid crystal display panel is bent toward the illuminating device, and the panel holding member and the FPC are accommodated in a box-shaped metal frame.

Therefore, in some cases, electronic parts mounted on the surface of the FPC, such as resistors and capacitors, are exposed to the outside of the liquid crystal display device in order to reduce the thickness and the size of an electronic apparatus. In this case, it is necessary to cover the electronic parts with an insulating tape to prevent an electrical short circuit between the electric parts due to contact therebetween.

Japanese Unexamined Patent Application Publication No. 11-259622 discloses a technique that covers a convex portion of an IC module with, for example, an adhesive tape when the IC module is interposed between card substrates.

However, when an insulating tape is used to prevent the electrical short circuit, dust is likely to be adhered to an adhesive portion of the insulating tape. When dust is adhered to the adhesive portion and contacts the electronic parts during a manufacturing process, an electrical short circuit is likely to occur. In the technique disclosed in Japanese Unexamined Patent Application Publication No. 11-259622, in order to prevent twist and folds occurring during adhesion between the IC module and the card substrates, a predetermined cutout is formed in the adhesive tape. However, when the adhesive tape is applied to the insulating tape, a space in which dust is directly adhered to the electronic parts is formed due to the cutout, which may cause an electrical short circuit between the electronic parts.

SUMMARY

An advantage of some aspects of the invention is that provides an electro-optical device and an electronic apparatus applicable to display various information items.

According to a first aspect of the invention, an electro-optical device includes: a display panel module having electronic parts provided therein; and an insulating tape that is adhered to the display panel module so as to cover the electronic parts. The insulating tape includes an adhesive portion and a non-adhesive portion. The non-adhesive portion is disposed at a position that covers a region in which the electronic parts are provided, and the adhesive portion is adhered to the display panel module in regions other than the region in which the electronic parts are provided.

In the electro-optical device having the above-mentioned structure, the electronic parts are provided in the display panel module. The display panel module includes a display panel, such as a liquid crystal panel. The insulating tape is adhered to the display panel module so as to cover the electronic parts. The insulating tape includes an adhesive portion and a non-adhesive portion. The non-adhesive portion is disposed at a position that covers a region in which the electronic parts are provided, and the adhesive portion is adhered to the display panel module in regions other than the region in which the electronic parts are provided.

Since the adhesive portion of the insulating tape has adhesion, dust is likely to be adhered to the surface of the adhesive portion. Therefore, when the adhesive portion of the insulating tape is adhered to the region in which the electronic parts are provided, a short circuit may occur between the electronic parts due to the dust adhered to the adhesive portion. However, in the electro-optical device according to the above-mentioned aspect, since the adhesive portion is not provided in the region in which the electronic parts are provided, it is possible to prevent a short circuit between the electronic parts.

In the electro-optical device according to the above-mentioned aspect, preferably, the display panel module includes a frame, and the insulating tape is adhered to the frame. According to this structure, the insulating tape adhered to the frame can prevent dust from being adhered to the electronic parts through the frame. Therefore, it is possible to prevent a short circuit between the electronic parts.

In the electro-optical device according to the above-mentioned aspect, preferably, the frame includes a window that exposes the electronic parts, and the insulating tape is adhered to the frame at the edge of the window. According to this structure, the electronic parts are exposed to the outside through the window formed in the frame, and the insulating tape is adhered so as to cover the window. Therefore, the window formed in the frame can prevent contact between the electronic parts and the frame. In addition, since the adhesive portion is not provided in the region in which the electronic parts are arranged, it is possible to prevent a short circuit between the electronic parts.

In the electro-optical device according to the above-mentioned aspect, preferably, the frame and the electronic parts are arranged such that they overlap each other in the thickness direction of the frame. According to this structure, since the frame and the electronic parts are arranged such that they overlap each other in the thickness direction of the frame, it is possible to reduce the thickness of an electro-optical device by a thickness corresponding to an overlap portion between the electronic parts and the frame.

In the electro-optical device according to the above-mentioned aspect, preferably, the height of the electronic parts is smaller than the thickness of the frame. In this structure, the electronic parts are covered with the insulating tape, and the insulating tape is arranged so as not to press the electronic parts. This structure makes it possible to prevent the insulating tape from pressing the electronic parts, and thus it is possible to prevent the insulating tape from being damaged due to the pressure of the insulating tape against the electronic parts, and prevent a foreign material from being adhered to the insulating tape. As a result, it is possible to prevent dust from being adhered to the electronic parts through the damaged insulating tape and thus prevent a short circuit between the electronic parts due to the dust.

In the electro-optical device according to the above-mentioned aspect, preferably, the display panel module includes a flexible substrate, and the electronic parts are provided on the flexible substrate. According to this structure, since the electronic parts can be provided on the flexible substrate, a separate substrate for mounting electronic parts is not needed, and it is not necessary to use a thick wiring substrate. In addition, it is possible to closely adhere the flexible substrate to the display panel. As a result, it is possible to further reduce the thickness of an electro-optical device.

In the electro-optical device according to the above-mentioned aspect, preferably, the insulating tape is adhered to the flexible substrate. According to this structure, the insulating tape is directly adhered to the flexible substrate, and the adhesive portion of the insulating tape is adhered to regions other than the region in which the electronic parts are provided. Therefore, it is possible to prevent a short circuit between electronic parts due to dust adhered to the adhesive portion, and thus it is possible to directly protect the electronic parts. In addition, since the insulating tape is closely adhered to the flexible substrate, it is possible to prevent the entry of dust from the outside.

In the electro-optical device according to the above-mentioned aspect, preferably, the display panel module includes a frame, the frame is arranged so as to overlap the flexible substrate, and the frame includes a window that exposes the electronic parts covered with the insulating tape. According to this aspect, since the insulating tape is directly adhered to the flexible substrate having electronic parts provided thereon, it is possible to directly protect the electronic parts. In addition, since the frame includes the window that exposes the electronic parts covered with the insulating tape, it is possible to overlap the electronic parts with the frame. As a result, it is possible to arrange the display panel module to which the insulating tape covering the electronic parts is adhered close to the frame.

In the electro-optical device according to the above-mentioned aspect, preferably, the display panel module includes a display panel, and the flexible substrate is connected to the display panel. In this structure, wiring lines of the flexible substrate having electronic parts provided thereon are connected to wiring lines of the display panel. Therefore, it is possible to reduce the thickness and the size of an electro-optical device by arranging the flexible substrate along the display panel. In addition, it is possible to provide an electronic apparatus using the electro-optical device. In this case, since the electronic apparatus includes the display panel capable of preventing a short circuit between the electronic parts provided thereon, it is possible to provide a high-quality electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to the accompanying drawings. In the following embodiments of the invention, a liquid crystal display device is used as an example of an electro-optical device. The electro-optical device to which the invention can be applied is not limited to the liquid crystal display device, but the invention can be applied to, for example, an organic EL (OLED: organic light emitting diode) device and a plasma panel.

Structure of Liquid Crystal Display Device

Figure 1:
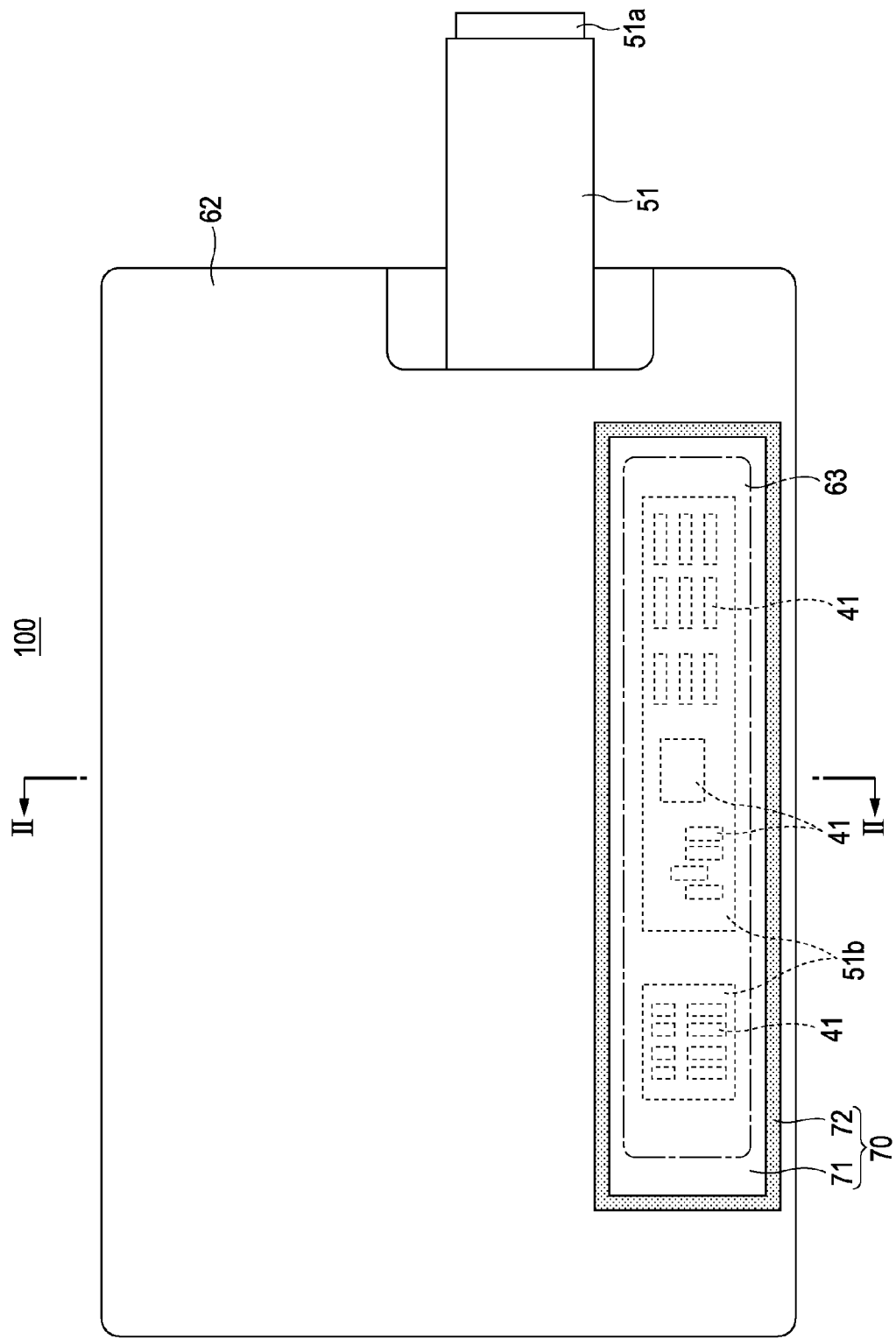
FIG. 1 is a plan view illustrating a liquid crystal display device according to an embodiment of the invention.
Figure 2:
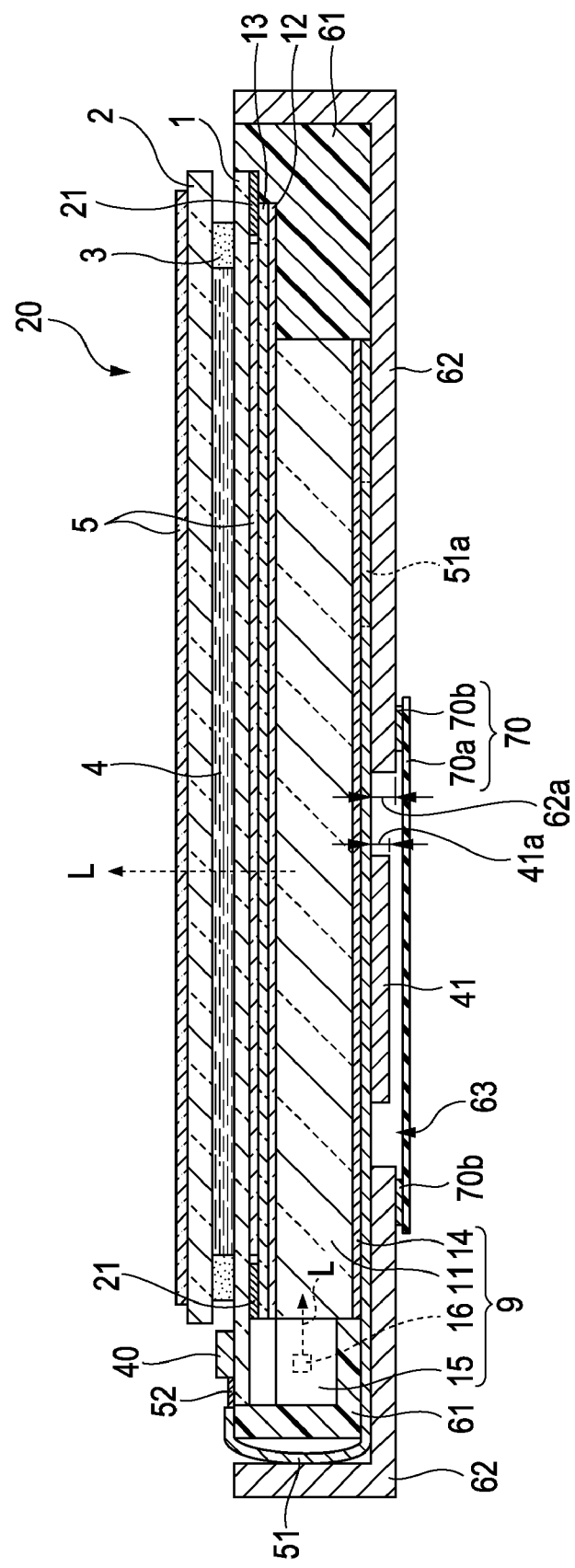
FIG. 2 is a cross-sectional view illustrating the liquid crystal display device according to the embodiment.

FIG. 1 is a plan view illustrating a liquid crystal display device 100 according to an embodiment of the invention. FIG. 2 is a cross-sectional view illustrating the liquid crystal display device 100 taken along the line II-II of FIG. 1.

As shown in FIGS. 1 and 2, the liquid crystal display device 100 mainly includes an illuminating device 9, a liquid crystal panel 20, serving as a display panel, a panel holding member 61, and a frame 62. The liquid crystal display device 100 is an example of a display panel module according to the invention. The liquid crystal panel 20 is arranged so as to face the upper surface of the light guide plate 11.

The illuminating device 9 includes a light guide plate 11, a reflecting sheet 14, and a light source 15. The reflecting sheet 14 is provided on a lower surface of the light guide plate 11. The light source 15 is provided on one end surface of the light guide plate 11 and includes a plurality of LEDs 16, which are point light sources. Light L emitted from each of the LEDs 16 is incident on the light guide plate 11 and travels through the light guide plate 11 while being repeatedly reflected from the upper and lower surfaces of the light guide plate 11. Then, the light is emitted from the upper surface of the light guide plate to the outside. The emitted light L travels toward the liquid crystal panel 20.

The liquid crystal panel 20 has a display surface that is substantially equal to the light emission surface of the light guide plate 11 in size. The liquid crystal panel 20 is manufactured by bonding substrates 1 and 2 made of, for example, glass with a sealing material 3 interposed therebetween to form a cell structure and injecting liquid crystal 4 into the cell structure. The liquid crystal panel 20 includes polarizing plates 5 that are provided on the outer surfaces of the substrates 1 and 2.

For example, optical sheets, such as a diffusion sheet 12 and a prism sheet 13, are provided between the illuminating device 9 and the liquid crystal panel 20. The diffusion sheet 12 diffuses the light L emitted from the light guide plate 11 in all directions. The prism sheet 13 focuses the light L on the liquid crystal panel 20. The prism sheet 13 is composed of an elongated prism that has a substantially triangular shape in a cross-sectional view and extends in the direction of one side (the direction of one side that is vertical to the cross-section). The light L emitted from the light guide plate 11 passes through the optical sheets and is then incident on the liquid crystal panel 20.

A driver IC 40, which is a liquid crystal driving IC (driver), is directly mounted on the liquid crystal panel 20 by a COG (chip on glass) technique. An FPC (flexible printed circuit) 51 is connected to one end of the liquid crystal panel 20, and some of the terminals of the driver IC 40 are connected to the FPC 51 through wiring lines 52 that are formed on the liquid crystal panel 20. A connector 51a is provided at the other end of the FPC 51. An external electronic apparatus is electrically connected to the connector 51a. In addition, electronic parts 41, such as resistors and capacitors, are provided in a region 51b of the FPC 51. The electronic parts 41 include, for example, solder. The driver IC 40 drives a driving circuit of the liquid crystal panel 20 on the basis of control signals that are supplied from an external electronic apparatus through the FPC 51. In this way, it is possible to control the alignment state of the liquid crystal 4.

The illuminating device 9, that is, the light guide plate 11, the reflecting sheet 14, and the light source 15 are fitted into an opening of a frame-shaped panel holding member 61 that is formed of, for example, resin. In addition, in the panel holding member 61, optical sheets, such as the diffusion sheet 12 and the prism sheet 13, are provided on the upper surface of the light guide plate 11. The liquid crystal panel 20 is adhered to the panel holding member 61 by, for example, a frame-shaped double-sided tape 21 having a light shielding property so as to cover the opening of the panel holding member 61.

The panel holding member 61 having the illuminating device 9 fitted into its opening and the liquid crystal panel 20 adhered thereto is accommodated in a box-shaped frame 62 that is formed of, for example, a metal plate. The frame 62 is provided with a window 63 that exposes the region 51b such that the frame does not contact the electronic parts 41. The window 63 of the frame 62 is a cavity. The window 63 makes it possible to reduce the thickness of a liquid crystal display device. That is, when the liquid crystal display device 100 is manufactured, the electronic parts 41 and the frame 62 overlap each other. Therefore, the window 63 makes it possible to reduce the thickness of the liquid crystal display device 100. In this embodiment, one window 63 is formed in the frame 62, but a plurality of windows may be formed in the frame 62 depending on the arrangement of the electronic parts 41. In FIG. 2, the thickness 62a of the frame 62 is shown to be larger than the height 41a of the electronic parts 41, but the height 41a of the electronic parts 41 may be larger than the thickness of 62a of the frame 62.

In addition, it is possible to reduce the weight of the frame 62 by forming the window 63 in the frame 62. As a result, it is possible to reduce the weight of the liquid crystal display device 100 provided with the frame 62. In order to reduce the weight of the frame 62, the area of the window 63 may be increased in the range in which the rigidity of the frame 62 is ensured.

The insulating tape 70 includes an insulating layer 70a and an adhesive layer 70b. The insulating layer 70a is formed of a material that does not transmit an electric current or heat and has no adhesion. The adhesive layer 70b includes an acryl-based adhesive and has adhesion.

The insulating tape 70 covers the window 63 that is provided so as to expose the region 51b in which the electronic parts 41 are arranged, and is adhered to the outer surface of the frame 62. The insulating tape 70 can prevent an electrical short circuit between the electronic parts 41 and a module that is provided outside the liquid crystal display device 100.

Structure of Insulating Tape

Next, the structure of the insulating tape 70 will be described in detail. As described above, it is possible to prevent a short circuit between electric parts by adhering the insulating tape 70 to the frame 62 so as to cover the window 63. However, when a portion of the adhesive layer 70b is not adhered to the frame 62, dust is likely to be adhered to the portion of the adhesive layer 70b that is not adhered to the frame 62 during or after a manufacturing process of the liquid crystal display device 100, since the adhesive layer 70b has adhesion. When the dust contacts the electronic parts 41, an electrical short circuit is likely to occur between the electric parts.

Figure 3:
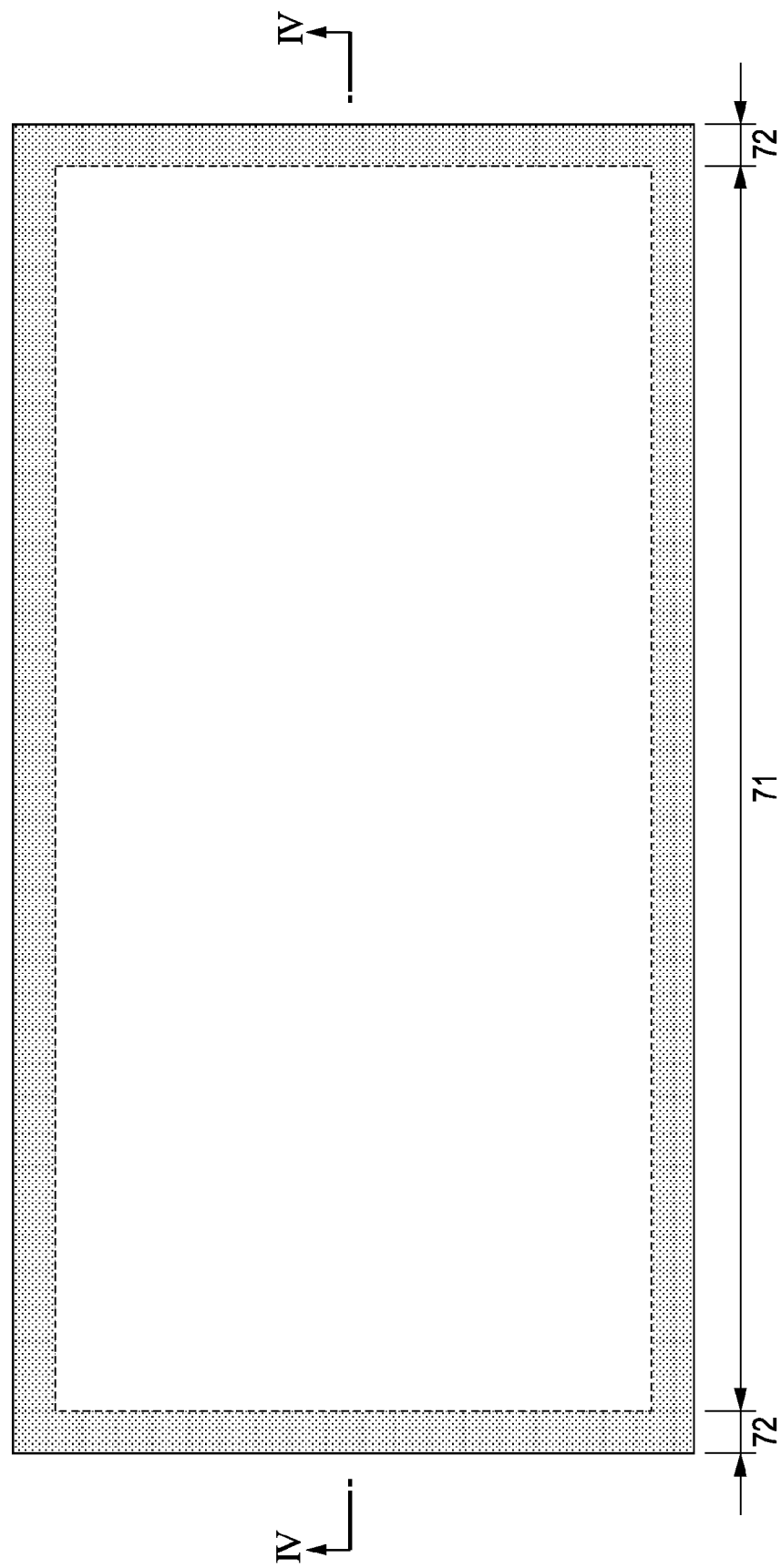
FIG. 3 is a plan view illustrating an insulating tape according to the embodiment.
Figure 4:
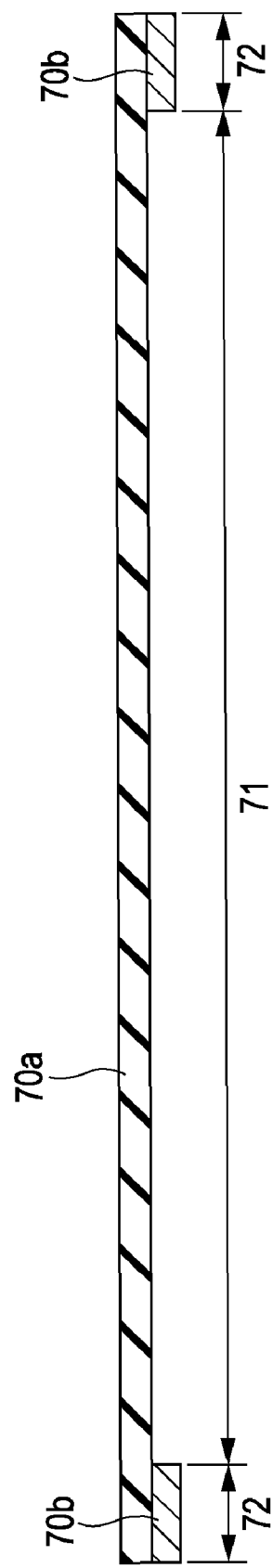
FIG. 4 is a cross-sectional view illustrating the insulating tape according to the embodiment.

Therefore, in the liquid crystal display device 100 according to this embodiment, as shown in the plan view of the insulating tape in FIG. 3, the insulating tape 70 is divided into a non-adhesive portion 71 and an adhesive portion 72. FIG. 4 is a cross-sectional view illustrating the insulating tape 70 taken along the line IV-IV of FIG. 3. The non-adhesive portion 71 is composed of only the insulating layer 70a, and the adhesive portion 72 includes the insulating layer 70a and the adhesive layer 70b. In the adhesive portion 72 shown in FIG. 4, the adhesive layer 70b is adhered to only one surface of the insulating layer 70a. However, the adhesive layer 70b may be adhered to both surfaces of the insulating layer 70a according to the design of a product.

The adhesive layer 70b is adhered to the outer surface of the frame 62 while the non-adhesive portion 71 of the insulating tape 70 is arranged so as to correspond to a region that covers the window 63 and the adhesive portion 72 is arranged so as to correspond to regions other than the region covering the window 63. In this way, the entire surface of the adhesive layer 70b of the adhesive portion 72 is adhered to the frame 62, and thus it is possible to removing a region in which the adhesive layer 70b is exposed, that is, a region in which dust is likely to be adhered. In this way, it is possible to prevent dust from being adhered to the insulating tape 70, and thus prevent contact between dust and the electronic parts 41.

In the structure of the insulating tape 70 shown in FIG. 3, the adhesive portion 72 is provided on all four sides of the insulating tape 70, but the invention is not limited thereto. For example, the adhesive portion 72 may be provided on only two sides opposite to each other among the four sides. In addition, a plurality of windows 63 may be formed in the frame 62 and the plurality of windows 63 may be covered with one insulating tape 70. In this case, the adhesive portion 72 may be provided at other positions in addition to the edge of the insulating tape 70. For example, when one insulating tape 70 covers two windows 63, the adhesive portion 72 may be provided such that the adhesive layer 70b is adhered to the boundary between the two windows 63 in the frame 62. In this case, it is also possible to remove a region in which dust is adhered to the adhesive layer 70b. As a result, it is possible to prevent dust from being adhered to the insulating tape 70, and thus prevent contact between the electronic parts 41 and the dust.

The insulating layer 70a of the insulating tape 70 may be formed of an insulating material having flexibility or elasticity. When the height 41a of the electronic parts 41 is larger than the thickness 62a of the frame 62, the electronic parts 41 may protrude from the frame 62. In this case, the insulating tape 70 is deformed according to the shapes of the electronic parts 41 to cover the electronic parts 41 without damaging the insulating tape 70. The insulating layer 70a may be formed of a resin-based material, such as polyester, polybutylene terephthalate, polycarbonate-polyetherimide, vinyl chloride resin, or polypropylene. In addition, the insulating layer may be formed in a single-layer structure or a multi-layer film structure. The multi-layer structure makes it possible to improve the performance of the insulating layer. Further, in the multi-layer structure, it is possible to add various functional films. Therefore, it is possible to obtain a thermal conduction sheet having high thermal conductivity by a combination of the functional layers in consideration of the adjustment of elasticity, the improvement of toughness, a light shielding property, the selection of transmittance, and heat dissipation. In this embodiment, for example, a polypropylene sheet is used as the insulating tape.

The invention is not limited to the above-described embodiment, but various modifications and changes of the invention can be made. Modifications will be described below.

First Modification

Figure 5:
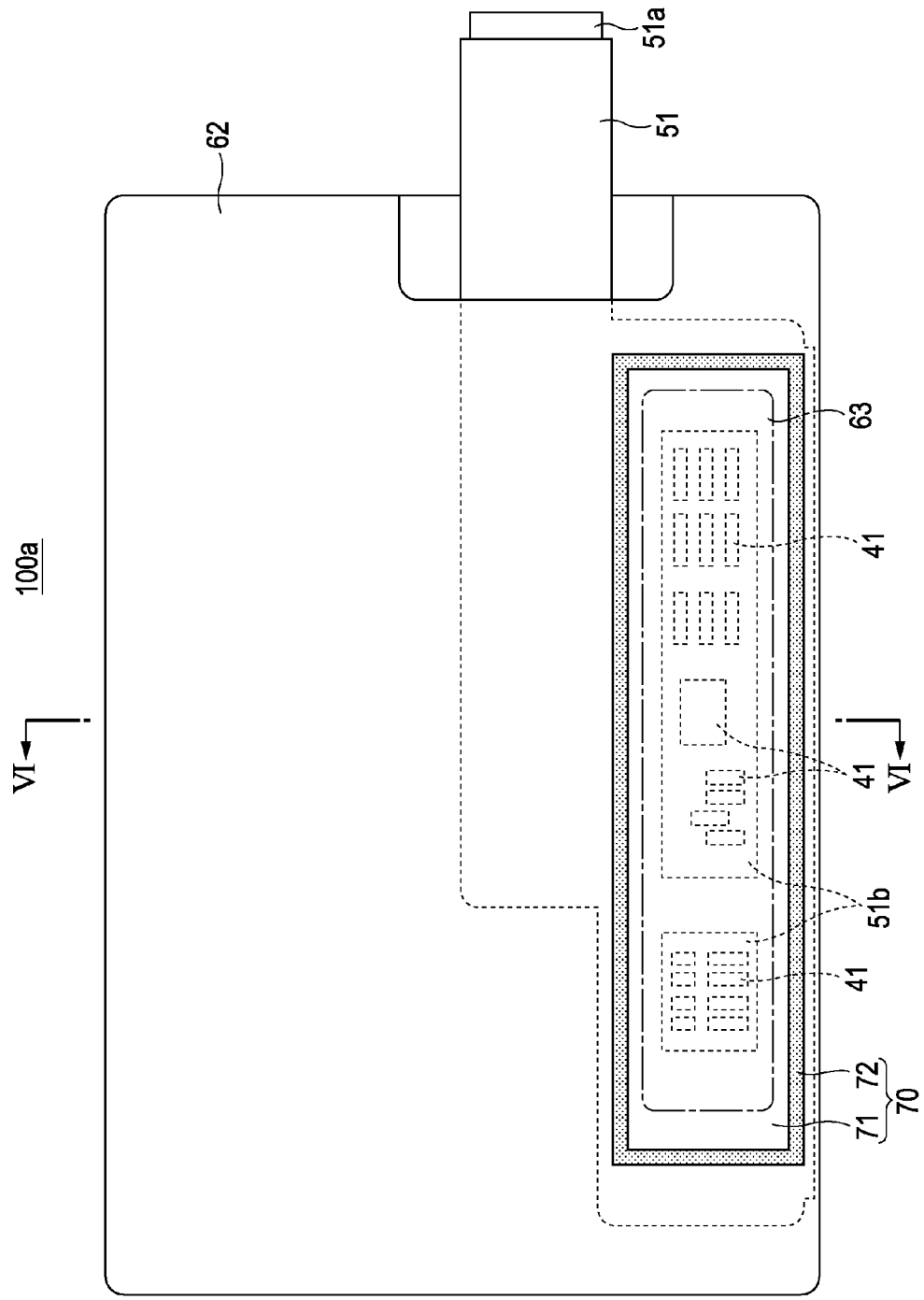
FIG. 5 is a plan view illustrating a liquid crystal display device according to a modification of the embodiment.
Figure 6:
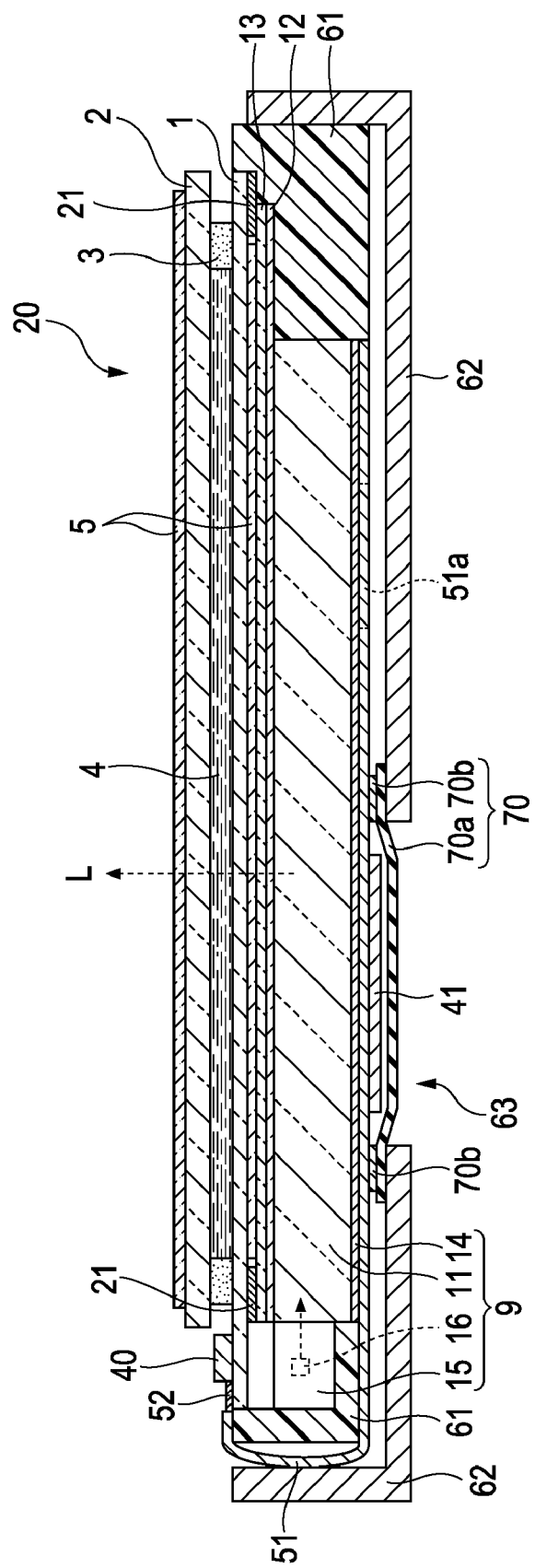
FIG. 6 is a cross-sectional view illustrating the liquid crystal display device according to the modification of the embodiment.

Next, a first modification of this embodiment will be described. In the liquid crystal display device 100 according to the above-described embodiment, the insulating tape 70 is adhered to the frame 62 to cover the region 51b in which the electronic parts 41 are arranged. However, the invention is not limited to the liquid crystal display device. FIG. 5 is a plan view illustrating a liquid crystal display device 100a according to the first modification. FIG. 6 is a cross-sectional view illustrating the liquid crystal display device 100a taken along the line VI-VI of FIG. 5. Hereinafter, the liquid crystal display device 100a according to the first modification will be described with reference to FIGS. 5 and 6.

In the liquid crystal display device 100a according to the first modification, the insulating tape 70 is adhered to the FPC 51 and the frame 62 is adhered to the FPC 51 with the insulating tape 70 interposed therebetween, unlike the liquid crystal display device 100 according to the above-described embodiment. That is, the insulating tape 70 is interposed between the FPC 51 and the frame 62. The window 63 is formed in the frame 62 so as to expose the electronic parts 41 on the FPC 51, in order to reduce the overall thickness of the liquid crystal display device 100a, similar to the above-described embodiment. As shown in FIG. 6, in the liquid crystal display device 100a, the insulating tape 70 and the electronic parts 41 covered with the insulating tape 70 protrude through the window 63.

In the liquid crystal display device 100a according to the first modification, the non-adhesive portion 71 is arranged at the position where the insulating tape 70 covers the electronic parts 41. In addition, the adhesive portion 72 is arranged so as to cover regions of the FPC 51 other than the region 51b in which the electronic parts 41 are arranged. The above arrangement makes it possible to remove a region in which dust is adhered to the adhesive layer 70b even when the insulating tape 70 is adhered to the FPC 51. Therefore, it is possible to prevent an electrical short circuit between the electronic parts 41 due to contact between dust and the electric parts 41.

In the liquid crystal display device 100a according to the first modification, as shown in FIG. 5, the adhesive portion 72 is provided at all four sides of the insulating tape 70, but the invention is not limited thereto. For example, the adhesive portion 72 may be provided at only two sides opposite to each other among the four sides. In addition, as shown in FIG. 5, when two regions 51b in which the electronic parts 41 are arranged are formed and the insulating tape 70 covers the two regions, the adhesive portion 72 may be provided between the two regions 51b and the adhesive layer 70b of the insulating tape 70 may be adhered to regions other than the two regions 51b.

Second Modification

Figure 7:
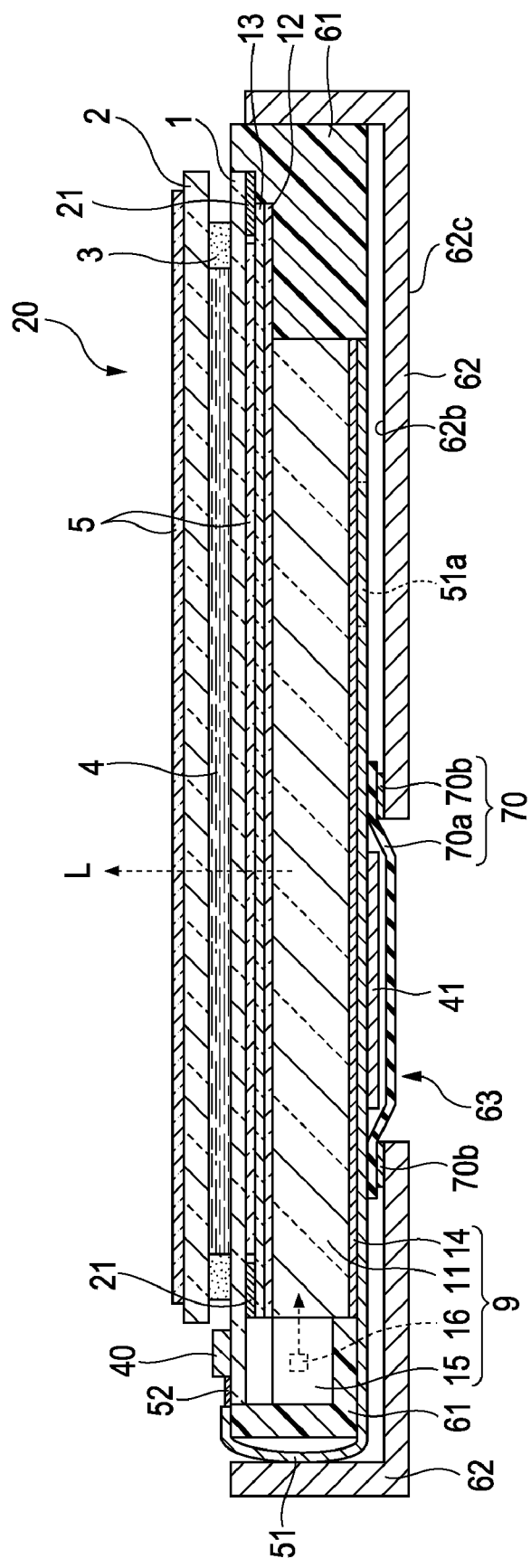
FIG. 7 is a cross-sectional view illustrating a liquid crystal display device according to another modification of the embodiment.

In the liquid crystal display device 100 according to the above-described embodiment, the insulating tape 70 is adhered to the frame 62 to cover the region 51b in which the electronic parts 41 are arranged. In this case, the insulating tape 70 is adhered to the outer surface of the frame 62. However, the invention is not limited thereto. The insulating tape 70 may be adhered to the inner surface of the frame 62. FIG. 7 is a cross-sectional view illustrating a liquid crystal display device according to the second modification. As shown in FIG. 7, a liquid crystal display device 100b includes the frame 62, and the window 63 is formed in the frame 62 at a position facing the electronic parts 41. The insulating tape 70 is adhered to an inner surface 62b of the frame 62 so as to cover the window 63 that exposes the region 51b in which the electronic parts 41 are arranged. The insulating tape 70 is adhered to the edge of the window 63.

When the thickness of the electronic parts 41 is larger than the sum of the thickness of the insulating layer 70a and the thickness of the adhesive layer 70b, the electronic parts 41 and the frame 62 are arranged so as to overlap each other in the thickness direction of the frame 62. In this case, the insulating tape 70 can be bent to cover the window 63. When the thickness of the electronic parts 41 is larger than the sum of the thickness of the insulating layer 70a, the thickness of the adhesive layer 70b, and the thickness of the frame 62, the electronic parts 41 protrude from an outer surface 62c of the frame 62. In this case, the insulating tape 70 can be bent to cover the window 63.

Therefore, the insulating tape 70 can prevent an electrical short circuit between the electronic parts 41 and a module that is provided outside the liquid crystal display device 10b. Since the edge of the insulating tape 70 is provided inside the frame 62, it is possible to prevent an operator from contacting the edge of the insulating tape 70 while assembling the liquid crystal display device 100b with another module. Therefore, it is possible to obtain the liquid crystal display device 100b having a structure in which the insulating tape 70 is less likely to be peeled off.

Third Modification

In the above-described embodiment, the electronic parts 41 include resistors, capacitors, and solder. Specifically, the electronic parts 41 include trimming capacitors, variable resistors, inductors, terminals used to test electric properties, semiconductor elements, connectors, and solider for connecting these elements to wiring lines.

Fourth Modification

In the above-described embodiment, the insulating tape 70 including the insulating layer 70a and the adhesive layer 70b formed thereon is used, but the adhesive layer 70b may be formed on the frame 62. The adhesive layer 70b is provided around the edge of the window 63 of the frame 62, and the insulating tape 70 may be provided so as to cover the window 63. In this case, it is also possible to prevent contact between the electronic parts 41 and dust. This structure may be applied to the second modification. In this case, the same effects as described above can also be obtained.

This structure may be applied to the first modification. In this case, the adhesive layer 70b is provided in a region of the FPC 51 in which no electronic part 41 is arranged, and the insulating tape 70 is arranged so as to cover the electronic parts 41. In this case, it is also possible to prevent contact between the electronic parts 41 and dust.

Fifth Modification

Figure 8A:
FIGS. 8A to 8F are plan views illustrating insulating tapes according to still another modification of the embodiment.

In the above-described embodiment, as shown in FIG. 3, the adhesive portion 72 is provided at the edge of the insulating tape 70, but the invention is not limited thereto. The adhesive portion 72 may not be provided at the edge of the insulating tape 70. FIGS. 8A to 8F are plan views illustrating adhesive portions of the insulating tapes. For example, as shown in FIG. 8A, adhesive portions 73a may be provided along two sides of an insulating tape 73 in the longitudinal direction. When the insulating tape 73 is adhered, the adhesive portions 73a are fixed to two places. Therefore, it is possible to easily adhere the insulating tape 73, as compared to the structure in which the edge of the insulating tape is adhered. In addition, it is possible to easily peel off the insulating tape 73, as compared to the structure in which the edge of the insulating tape is adhered.

Figure 8B:
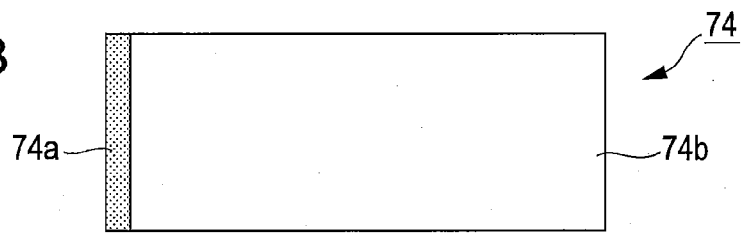

Further, for example, as shown in FIG. 8B, an adhesive portion 74a may be provided at one side of an insulating tape 74 in the longitudinal direction. When the insulating tape 74 is adhered, the adhesive portion 74a is fixed to one place. Therefore, it is possible to easily adhere the insulating tape, as compared to the structure in which the adhesive portions are fixed to two places. In addition, it is possible to easily peel off the insulating tape 74, as compared to the structure in which the adhesive portion is fixed to two places. In this case, since an end portion 74b opposite to the adhesive portion 74a is not fixed, it is preferable to fix the insulating tape with, for example, the frame 62, as in the first modification.

Figure 8C:
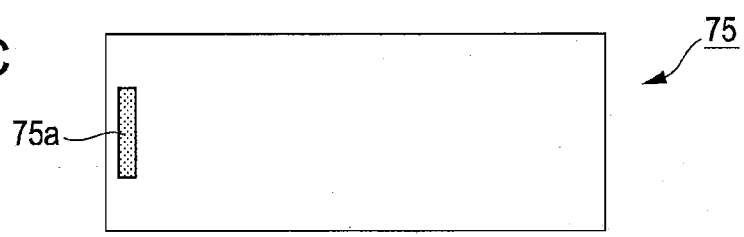

Furthermore, for example, as shown in FIG. 8C, an adhesive portion 75a may be partially provided at one side of an insulating tape 75 in the longitudinal direction. Therefore, it is possible to easily adhere the insulating tape, as compared to the structure in which the adhesive portion 75a is provided at the entire one side of the insulating tape. In this case, since an end portion 75b opposite to the adhesive portion 75a is not fixed, it is preferable to fix the insulating tape with, for example, the frame 62, as in the first modification.

Figure 8D:
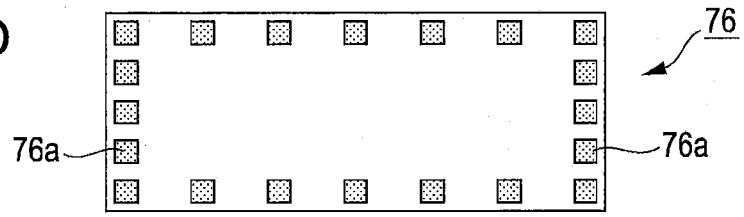
Figure 8E:
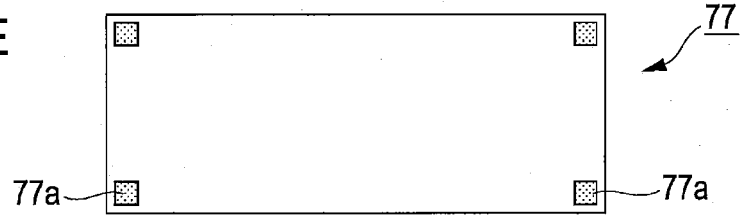

Further, for example, as shown in FIG. 8D, adhesive portions 76a may be discontinuously provided at the edge of an insulating tape 76. In this case, it is possible to easily peel off the insulating tape, as compared to the structure in which the adhesive portion 76a is continuously provided. For example, as shown in FIG. 8E, adhesive portions 77a may be provided at four corners of an insulating tape 77. In this case, it is possible to easily adhere or peel off the insulating tape, as compared to the structure in which the adhesive portion 76a is provided at the edge of the insulating film.

Figure 8F:
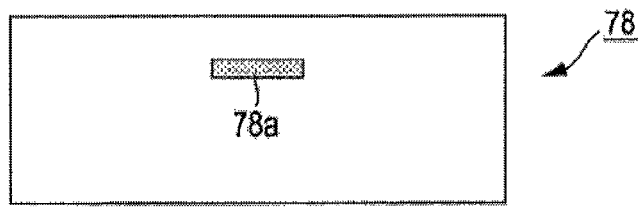

Furthermore, for example, as shown in FIG. 8F, an adhesive portion 78a may be provided in a portion of the insulating tape 78 other than the edge thereof. In this case, since the edge of the insulating tape 78 is not fixed, it is preferable to press the insulating tape with, for example, the frame 62 to fix the insulating tape, as in the first modification. The insulating tape 78 is arranged such that the adhesive portion 78a faces a region in which no electronic part 41 is arranged on the FPC 51. In this case, it is also possible to easily adhere or peel off the insulating tape, as compared to the structure in which the adhesive portion 76a is provided at the edge of the insulating tape.

Sixth Modification

In the above-described embodiment, an adhesive including an acryl-based adhesive is used for the adhesive layer 70b, but other adhesives or gluing agents may be used. Any type of adhesive or gluing agent may be used as long as it can adhere the insulating tape 70 to the FPC 51 or the frame 62 and does not generate gas that corrodes, for example, the electronic parts 41, wiring lines, and substrates. As the adhesive or the gluing agent, any of the following materials may be used: a natural rubber-based adhesive; a starch-based adhesive; a glue-based adhesive; a urethane resin-based adhesive; ester-based cellulose; an ethylene-vinyl acetate-based adhesive; an epoxy resin-based adhesive; and a silicon-based adhesive. Since the adhesive performances of the adhesive and the gluing agent depend on a fixing material, it is preferable to select an adhesive or a gluing agent by experiments. The FPC 51 and the insulating tape 70 may be fixed to each other by thermal compression bonding, without using an adhesive or a gluing agent. In this case, it is possible remove a process of applying an adhesive or a gluing agent on the insulating tape 70. This may be applied to the above-described modifications.

Seventh Modification

In the above-described embodiment, the insulating tape 70 may be loosely adhered to the frame 62. In this case, even when the height 41a of the electronic parts 41 is larger than the thickness 62a of the frame 62, it is possible to prevent the damage of the electronic parts 41 since the insulating tape 70 hardly presses the electronic parts 41.

Electronic Apparatuses

Next, examples of electronic apparatuses to which the liquid crystal display devices 100 and 100a according to the above-described embodiment can be applied will be described with reference to FIGS. 9A and 9B.

First, an example in which the liquid crystal display device 100 according to the above-described embodiment is applied to a display unit of a portable personal computer (a so-called notebook computer) will be described. FIG. 9A is a perspective view illustrating the structure of the portable personal computer. As shown in FIG. 9A, a personal computer 710 includes a main body 712 having a keyboard 711 and a display unit 713 to which the liquid crystal display device 100 according to the above-described embodiment is applied.

Next, an example in which the liquid crystal display device 100 or 100a according to the above-described embodiment is applied to a display unit of a mobile phone will be described. FIG. 9B is a perspective view illustrating the structure of the mobile phone. As shown in FIG. 9B, a mobile phone 720 includes a plurality of operating buttons 721, an earpiece 722, a mouthpiece 723, and a display unit 724.

Figure 9A:
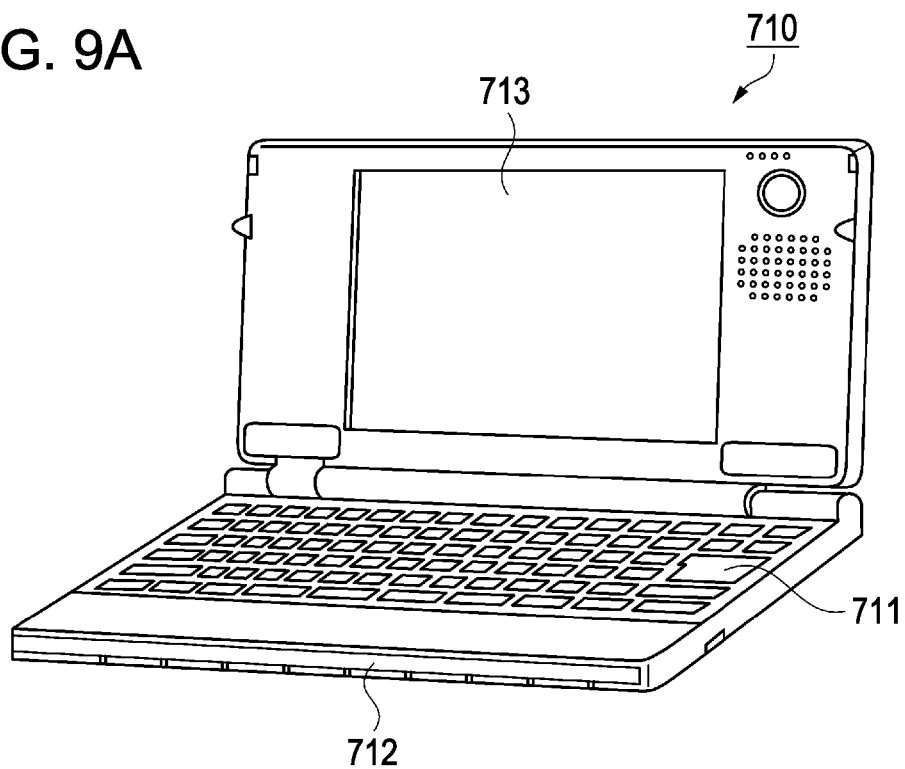
FIGS. 9A and 9B are perspective views illustrating electronic apparatuses to which the liquid crystal display device according to the embodiment of the invention is applied.
Figure 9B:
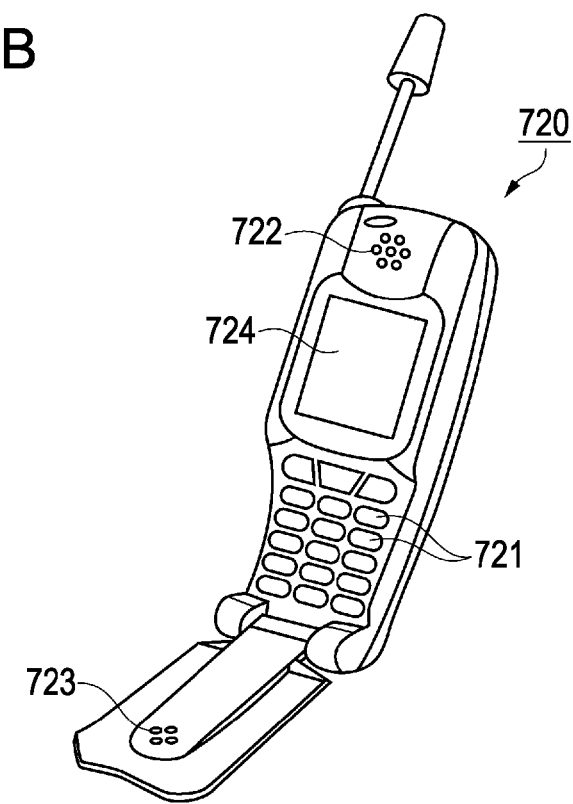

In addition to the personal computer and the mobile phones shown in FIGS. 9A to 9C, the liquid crystal display device 100 or 100a according to the above-described embodiment can be applied to various electronic apparatuses, such as a liquid crystal television, a viewfinder-type or a monitor-direct-view-type video recorder, a car navigation apparatus, a pager, an electronic organizer, an electronic calculator, a word processor, a workstation, a video telephone, a POS terminal, and a digital still camera.

According to the above-described embodiment of the invention, an insulating tape includes an adhesive portion and a non-adhesive portion. The non-adhesive portion is arranged at a position that covers a region in which electronic parts are provided, and the adhesive portion is adhered to a display panel module in regions other than the region in which the electronic parts are provided. In this way, it is possible to prevent an electrical short circuit between electronic parts due to contact between dust and the electronic parts caused by the adhesion of dust to the adhesive portion of the insulating tape. Therefore, the invention can be applied to various electro-optical devices, such as a liquid crystal display device, an electro-luminescent device, and a plasma display panel, and various electronic apparatuses, such as a mobile phone, a personal computer, a liquid crystal television, a viewfinder-type or a monitor-direct-view-type video recorder, a car navigation apparatus, a pager, an electrophoresis apparatus, an electronic organizer, an electronic calculator, a word processor, a workstation, a video telephone, a POS terminal, electronic apparatuses provided with touch panels, and apparatuses provided with electron emitters (FED: field emission display and SCEED: surface-conduction electron-emitter display).

What is claimed is:

1. An electro-optical device comprising:
   a display panel module having electronic parts provided therein; and
   an insulating tape that is adhered to the display panel module so as to cover the electronic parts,
   wherein the insulating tape includes an adhesive portion and a non-adhesive portion,
   the non-adhesive portion is disposed at a position that covers a region in which the electronic parts are provided, and
   the adhesive portion is adhered to the display panel module in regions other than the region in which the electronic parts are provided.

2. The electro-optical device according to claim 1, wherein the display panel module includes a frame, and the insulating tape is adhered to the frame.

3. The electro-optical device according to claim 2,
   wherein the frame includes a window that exposes the electronic parts, and
   the insulating tape is adhered to the frame at the edge of the window.

4. The electro-optical device according to claim 3,
   wherein the frame and the electronic parts are arranged such that they overlap each other in the thickness direction of the frame.

5. The electro-optical device according to claim 3,
   wherein the height of the electronic parts is smaller than the thickness of the frame.

6. The electro-optical device according to claim 1,
   wherein the display panel module includes a flexible substrate, and
   the electronic parts are provided on the flexible substrate.

7. The electro-optical device according to claim 6,
   wherein the display panel module includes a display panel, and
   the flexible substrate is connected to the display panel.

8. The electro-optical device according to claim 1,
   wherein the display panel module includes a flexible substrate, and
   the insulating tape is adhered to the flexible substrate.

9. The electro-optical device according to claim 8,
   wherein the display panel module includes a frame,
   the frame is arranged so as to overlap the flexible substrate, and
   the frame includes a window that exposes the electronic parts covered with the insulating tape.

10. An electronic apparatus comprising the electro-optical device according to claim 1.

* * * * *